(12) United States Patent
Schloerke et al.

(10) Patent No.: US 8,446,726 B2
(45) Date of Patent: May 21, 2013

(54) SEMICONDUCTOR MODULE HAVING AN INSERT AND METHOD FOR PRODUCING A SEMICONDUCTOR MODULE HAVING AN INSERT

(75) Inventors: Ralf Schloerke, Ruethen (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 258 days.

(21) Appl. No.: 12/914,171

(22) Filed: Oct. 28, 2010

(65) Prior Publication Data

US 2012/0106086 A1    May 3, 2012

(51) Int. Cl.
*H05K 7/20*      (2006.01)
*H01L 23/34*    (2006.01)
*F28F 7/00*      (2006.01)

(52) U.S. Cl.
USPC ........... 361/704; 361/709; 361/715; 361/719; 363/141; 174/526; 174/547; 257/712; 165/80.3

(58) Field of Classification Search
USPC ........ 361/679.46–679.54, 688–723; 363/141; 174/526, 547; 257/712, 721–722; 165/80.2–80.3
See application file for complete search history.

(56) References Cited

U.S. PATENT DOCUMENTS

| | | | |
|---|---|---|---|
| 7,511,961 B2 * | 3/2009 | Tschirbs et al. | 361/704 |
| 2006/0194884 A1 * | 8/2006 | Holcomb | 516/82 |
| 2007/0165376 A1 * | 7/2007 | Bones et al. | 361/688 |
| 2007/0278669 A1 | 12/2007 | Hierholzer et al. | |
| 2009/0021916 A1 | 1/2009 | Stolze | |
| 2009/0201649 A1 * | 8/2009 | Jerg et al. | 361/707 |
| 2010/0134979 A1 * | 6/2010 | Obiraki et al. | 361/709 |
| 2010/0302741 A1 | 12/2010 | Kanschat et al. | |

FOREIGN PATENT DOCUMENTS

| | | |
|---|---|---|
| DE | 10 2008 033 465 A1 | 7/2007 |
| DE | 10 2006 025 453 A1 | 12/2007 |
| DE | 10 2009 026 558 B3 | 12/2010 |

OTHER PUBLICATIONS

Thyristor/Diode Modules with DCB* Construction, IXYS, ABB-IXYS Semiconductor GmbH, Service No. 350.

* cited by examiner

*Primary Examiner* — Zachary M Pape
(74) *Attorney, Agent, or Firm* — Murphy, Bilak & Homiller, PLLC (57) ABSTRACT

A power semiconductor module includes a module housing with a sealing ring on its top side. The sealing ring, in cooperation with the module housing and a printed circuit board attached to the power semiconductor module, hermetically seals feed-through locations at the top side of the module housing for feeding through electric terminals of the power semiconductor module. On the bottom side of the module housing a sealing ring hermetically seals the bottom side of the module housing.

23 Claims, 8 Drawing Sheets

SEMICONDUCTOR MODULE HAVING AN INSERT AND METHOD FOR PRODUCING A SEMICONDUCTOR MODULE HAVING AN INSERT

FIELD OF TECHNOLOGY

The invention relates to semiconductor modules, and particularly to semiconductor modules having an insert.

BACKGROUND

Power electronics modules are semiconductor modules used in power electronics circuitry. Power electronics modules are employed typically in vehicular, rail and industrial applications, for example in inverters or rectifiers. They likewise find application in the form of energy generation and transmission. The semiconductor components contained in the power electronics modules may involve e.g. semiconductor chips including an insulated gate (IGBT), a metal oxide field-effect transistor (MOSFET), a junction field-effect transistor (JFET), a thyristor, or a diode.

Many semiconductor modules comprise a number of electric terminals feed through a top side of the module housing so as to enable an electric connection to an external printed circuit board or the like. At the bottom side of the module, a substrate may be adhered to the module housing. However, it turned out that if the module is operated in a corrosive atmosphere containing corrosive compounds, for example water vapor, salt fog, hydrogen sulfide ($H_2S$), acid sulphur ($H_2SO_4$), there is a risk that the corrosive compound(s) enter the interior of the module, as the feed-through locations and/or adherent does not sufficiently inhibit the intrusion of the corrosive compound(s). Inside the module, the corrosive compound(s) may cause the growth of dendrites in particular between copper conductor operated at different electric potentials. Finally, such dendrites can cause electrical shorts between the copper conductors. Hence, there is a need for an improved solution.

SUMMARY

According to an embodiment of a semiconductor module, the semiconductor module includes a module housing, a power semiconductor chip, a substrate, a plurality of electric terminals, and a first sealing ring. The module housing has a top side and a bottom side forming opposite sides of the module housing and being spaced apart from one another in a vertical direction. The substrate carries the power semiconductor chip and is mechanically joined with the module housing. The plurality of electric terminals extend from the interior of the module housing to the exterior of the module housing and penetrate the top side of the module housing at feed-through locations. The first sealing ring is arranged on the top side of the module housing such that in any lateral direction perpendicular to the vertical direction the plurality of electric terminals are arranged within an inner lateral boundary of the first sealing ring.

According to an embodiment of a semiconductor module system, the system includes a power semiconductor module and a counter holder. The power semiconductor module includes a module housing, a power semiconductor chip, a substrate, a plurality of electric terminals, and a first sealing ring. The module housing has a top side and a bottom side forming opposite sides of the module housing and being spaced apart from one another in a vertical direction. The substrate carries the power semiconductor chip and is mechanically joined with the module housing. The plurality of electric terminals extend from the interior of the module housing to the exterior of the module housing and penetrate the top side of the module housing at feed-through locations. The first sealing ring is arranged on the top side of the module housing such that in any lateral direction perpendicular to the vertical direction the plurality of electric terminals are arranged within an inner lateral boundary of the first sealing ring. The counter holder, which includes a bottom side on which a third sealing ring is arranged, is arranged on the top side of the module housing with the bottom side facing toward the top side of the module housing such that in any lateral direction perpendicular to the vertical direction the plurality of electric terminals are arranged within an inner lateral boundary of the third sealing ring.

According to an embodiment of a semiconductor module arrangement, the arrangement includes a power semiconductor module and a printed circuit board. The power semiconductor module includes a module housing, a power semiconductor chip, a substrate, a plurality of electric terminals, and a first sealing ring. The module housing has a top side and a bottom side forming opposite sides of the module housing and being spaced apart from one another in a vertical direction. The substrate carries the power semiconductor chip and is mechanically joined with the module housing. The plurality of electric terminals extend from the interior of the module housing to the exterior of the module housing and penetrate the top side of the module housing at feed-through locations. The first sealing ring is arranged on the top side of the module housing such that in any lateral direction perpendicular to the vertical direction the plurality of electric terminals are arranged within an inner lateral boundary of the first sealing ring. The printed circuit board, which has a plurality of counter terminals, is arranged on the top side of the module housing such that each one of the terminals forms an electric contact with one of the counter terminals. The printed circuit board, the first sealing ring and the module housing together hermetically seal the feed-through locations on the top side of the module housing.

According to another embodiment of a semiconductor module arrangement, the arrangement includes a power semiconductor module, a counter holder, and a printed circuit board. The power semiconductor module includes a module housing, a power semiconductor chip, a substrate, a plurality of electric terminals, and a first sealing ring. The module housing has a top side and a bottom side forming opposite sides of the module housing and being spaced apart from one another in a vertical direction. The substrate carries the power semiconductor chip and is mechanically joined with the module housing. The plurality of electric terminals extend from the interior of the module housing to the exterior of the module housing and penetrate the top side of the module housing at feed-through locations. The first sealing ring is arranged on the top side of the module housing such that in any lateral direction perpendicular to the vertical direction the plurality of electric terminals are arranged within an inner lateral boundary of the first sealing ring. The counter holder comprises a bottom side on which a third sealing ring is arranged. The printed circuit board has a plurality of counter terminals. The counter holder and the printed circuit board are arranged on the top side of the module housing such that the printed circuit board is arranged between the counter holder and the power semiconductor module, each one of the terminals forms an electric contact with one of the counter terminals, and the counter holder, the printed circuit board and the first sealing ring together hermetically seal the feed-through locations on the top side of the module housing.

According to yet another embodiment of a semiconductor module arrangement, the arrangement includes a power semiconductor module, a printed circuit board, and a heat sink. The power semiconductor module includes a module housing, a power semiconductor chip, a substrate, a plurality of electric terminals, a first sealing ring, and a second sealing ring. The module housing has a top side and a bottom side forming opposite sides of the module housing and being spaced apart from one another in a vertical direction. The module housing further includes a mounting frame and an inner housing arranged within the mounting frame. The substrate, which carries the power semiconductor chip, is mechanically joined with the module housing. The plurality of electric terminals extend from the interior of the inner module housing to the exterior of the inner module housing and penetrate the top side of the inner module housing at feed-through locations. The first sealing ring is arranged on the mounting frame on the top side of the module housing. The second sealing ring is arranged on the mounting frame on the bottom side of the module housing. The printed circuit board comprises a plurality of counter terminals. The printed circuit board is arranged on the top side of the module housing and the heat sink is arranged on the bottom side of the module housing such that each one of the terminals forms an electric contact with one of the counter terminals, and the printed circuit board, the first sealing ring, the mounting frame, the second sealing ring and the heat sink together hermetically seal the inner module housing.

According to still another embodiment of a semiconductor module arrangement, the arrangement includes a power semiconductor module, a printed circuit board, a counter holder and a heat sink. The power semiconductor module includes a module housing, a power semiconductor chip, a substrate, a plurality of electric terminals, a first sealing ring, and a second sealing ring. The module housing includes a top side and a bottom side forming opposite sides of the module housing and being spaced apart from one another in a vertical direction. The module housing further includes a mounting frame and an inner housing arranged within the mounting frame. The substrate, which carries the power semiconductor chip, is mechanically joined with the module housing. The plurality of electric terminals extend from the interior of the inner module housing to the exterior of the inner module housing and penetrate the top side of the inner module housing at feed-through locations. The first sealing ring is arranged on the mounting frame on the top side of the module housing. The second sealing ring is arranged on the mounting frame on the bottom side of the module housing. The printed circuit board comprises a plurality of counter terminals. The counter holder has a bottom side on which a third sealing ring is arranged. The counter holder and the printed circuit board are arranged on the top side of the module housing and the heat sink is arranged on the bottom side of the module housing such that the printed circuit board is arranged between the counter holder and the power semiconductor module, each one of the terminals forms an electric contact with one of the counter terminals, and the counter holder, the third sealing ring, the printed circuit board, the first sealing ring, the mounting frame, the second sealing ring and the heat sink together hermetically seal the inner module housing.

According to an embodiment of a method for assembling a semiconductor module arrangement, the method includes providing a power semiconductor module, a printed circuit board, and a heat sink. The power semiconductor module comprises a module housing, a power semiconductor chip, a substrate, a plurality of electric terminals, and a first sealing ring. The module housing has a top side and a bottom side which are spaced apart from one another in a vertical direction and which form opposite sides of the module housing. The substrate, which carries the power semiconductor chip, is mechanically joined with the module housing. The plurality of electric terminals, which extend from the interior of the module housing to the exterior of the module housing, penetrate the top side of the module housing at feed-through locations. The first sealing ring is arranged on the top side of the module housing around the electric terminals. The printed circuit board comprises a plurality of counter terminals. When assembling these components, the power semiconductor module is arranged between the printed circuit board and the heat sink. Thereby, the top side of the module housing faces the printed circuit board, and the bottom side of the module housing faces the heat sink. The printed circuit board, the power semiconductor module and the heat sink are pressed against one another such that the first sealing ring is compressed by the printed circuit board and the module housing and the second sealing ring is compressed by the heat sink and the module housing. During the step of pressing, each one of the terminals forms an electric contact with one of the counter terminals. As a result, the printed circuit board, the first sealing ring and the module housing together hermetically seal the feed-through locations on the top side of the module housing, and the module housing, the second sealing ring and the heat sink together hermetically seal the bottom side of the joining means.

According to another embodiment of a method for assembling a semiconductor module arrangement, the method includes providing a power semiconductor module, a printed circuit board, a counter holder, and a heat sink. The power semiconductor module comprises a module housing, a power semiconductor chip, a substrate, a plurality of electric terminals, and a first sealing ring. The module housing has a top side and a bottom side which are spaced apart from one another in a vertical direction and which form opposite sides of the module housing. The substrate, which carries the power semiconductor chip, is mechanically joined with the module housing. The plurality of electric terminals, which extend from the interior of the module housing to the exterior of the module housing, penetrate the top side of the module housing at feed-through locations. The first sealing ring is arranged on the top side of the module housing around the electric terminals. The printed circuit board comprises a plurality of counter terminals. On a bottom side of the counter holder a third sealing ring is arranged. When assembling these components, the printed circuit board is arranged between the counter holder and the power semiconductor module and the power semiconductor module between the printed circuit board and the heat sink. Thereby, the bottom side of the counter holder faces the printed circuit board and the module housing, the top side of the module housing faces the printed circuit board, and the bottom side of the module housing faces the heat sink. The counter holder, the printed circuit board, the power semiconductor module and the heat sink are pressed against one another such that the first sealing ring is compressed by the printed circuit board and the module housing, the second sealing ring is compressed by the heat sink and the module housing, and the third sealing ring is compressed by the counter holder and the module housing. During the step of pressing, each one of the terminals forms an electric contact with one of the counter terminals. As a result, the counter holder, the third sealing ring, the printed circuit board, the first sealing ring and the module housing together hermetically seal the feed-through locations on the top side of the module housing, and the module housing, the second sealing ring and the heat sink together hermetically seal the bottom side of the joining means.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
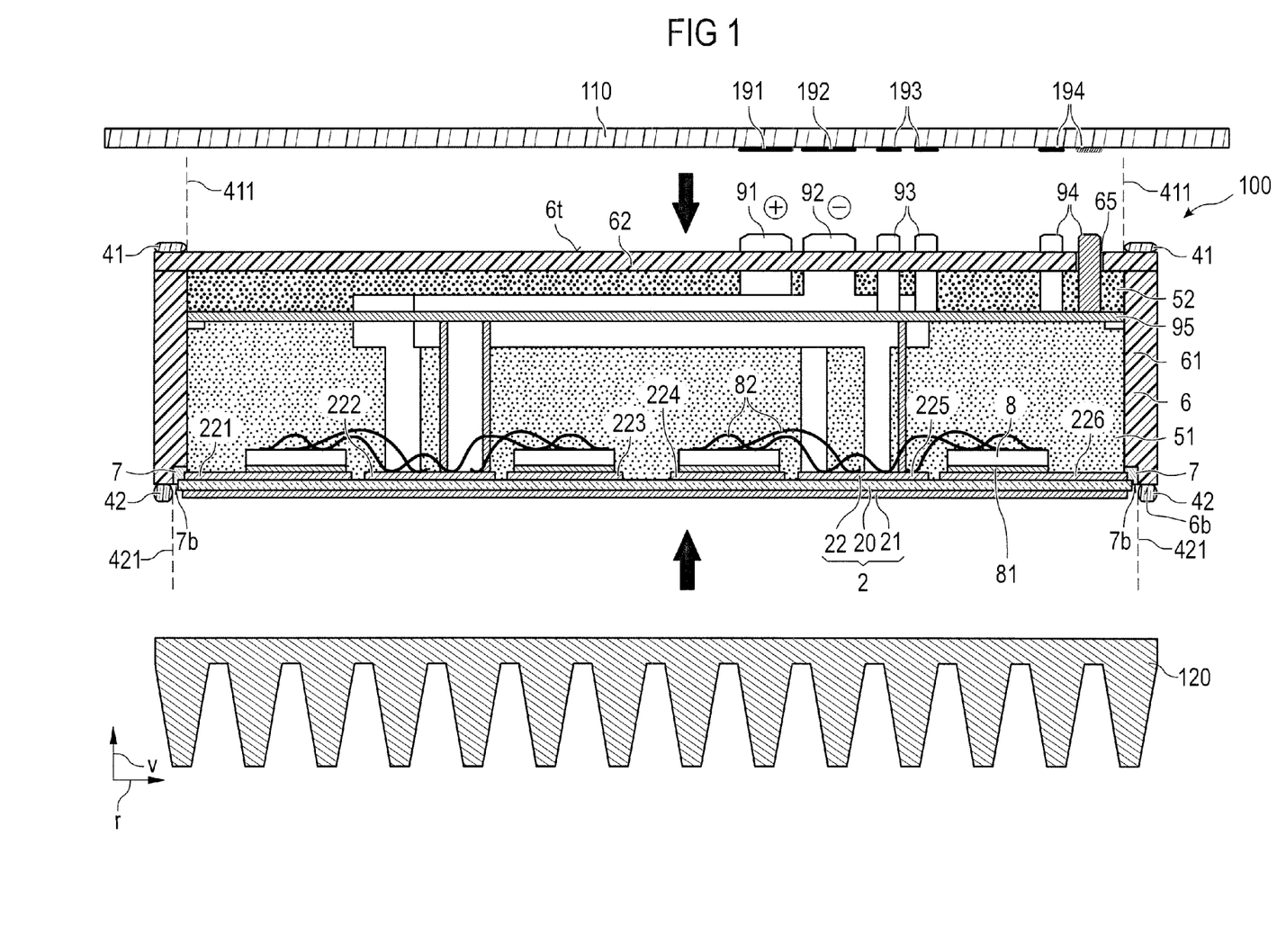
FIG. 1 is a vertical section through a power semiconductor arrangement with a power semiconductor module, a heat sink and an external printed circuit board prior to being assembled, wherein the power semiconductor module is furnished with a first sealing ring and a second sealing ring.

Referring now to FIG. 1 there is illustrated a vertical cross-sectional view of a power semiconductor module 100, which comprises a module housing 6 with a side wall 61 and an optional housing cover 62. The housing may be electrically insulating and, for instance, made of plastics. A top side 6$t$ of the module housing 6 and a bottom side 6$b$ of the module housing 6 are spaced apart from one another in a vertical direction v. The module 100 includes one or more power semiconductor chips 8 arranged on a substrate 2. A substrate 2, which exhibits a dielectric layer 20 coated on its top side with a top side metallization layer 22 and on its bottom side with a bottom side metallization layer 21, serves as a carrier and as a circuit board for the power semiconductor chips 8. Optionally, the top side metallization layer 22 may include conductor paths and/or conductor pads 221, 222, 223, 224, 225, 226.

The metallization layers 21 and 22 are solidly bonded to the insulation carrier 20 which may be, for example, a suitable ceramic material such as aluminum nitride (AlN), aluminum oxide (Al2O3), silicon nitride (Si3N4), silicon carbide (SiC) or beryllium oxide (BeO), for instance. The metallizations 21 and 22 are made of copper or an copper alloy. The insulating substrate 2 may be, for example, a direct copper bonded (DCB) or a direct aluminum brazed (DAB) or an active metal brazed (AMB) substrate. Optionally, the metallizations 21 and/or 22 may be uncoated or, independently from one another, further coated with one or more of the materials silver, NiAu, NiPd, NiPdAu to produce a solderable surface or to facilitate LTJT (low temperature joining technique) joints between a semiconductor chip and the top metallization layer 22.

The substrate 2 is arranged at the bottom side 6$b$ of the module housing 6 and elastically or inelastically joined with the module housing 6 using a joining means 7, for example a glue or a silicone. The bottom side 7$b$ of the joining means 7, that is the side of the joining means 7 facing away from the top side 6$t$ of the module housing 6, is not completely covered with the substrate 2.

The power semiconductor chips 8 are mounted on the top side metallization layer 22 and connected thereto by a bonding layer 81, for example of solder, an electrically conductive adhesive or a silver pressure sintered bond. The power semiconductor chips 8 may be, for example, controllable power semiconductor switches such as, for example, MOSFETs, IGBTs, thyristors, JFETs or power diodes. The power semiconductor chips 8 may be semiconductor chips 8 featuring high nominal currents exceeding 50 A or 75 A and/or high nominal blocking voltages exceeding 400 V, for example. In addition, the footprint of a power semiconductor chip may be sized to more than or equal to 5.5 mm by 5.5 mm or 7 mm by 7 mm.

The power semiconductor chips 8 and/or the top side metallization layer 22 may be electrically interconnected by bond wires 82. Instead of bond wires 82 metal clips may also be provided and, for example, electrically conductively connected to the top of the chips 8 and/or the top side metallization layer 22 by soldering, by electrically conductive adhesive bonding or silver pressure sintered bonding.

The power semiconductor chip 8 is topped by an optional internal printed circuit board (PCB) 95 for circuiting internal driver terminals. The PCB 95 may be componented with electronics to control the controllable chips of the power semiconductor chips 8. Power semiconductor modules sophisticated with control electronics are also termed "intelligent" (IPMs).

To connect the power semiconductor module 100 externally to, for example, an external printed circuit board 110, electric terminals 91, 92, 93, 94 are provided. For instance, the external printed circuit board 110 may comprise a control circuit for controlling the module 100. For the sake of clearness, in FIG. 1 the control circuit is suppressed. In order to electrically contact the electric terminals 91, 92, 93, 94, the printed circuit board 110 is furnished with electric counter terminals 191, 192, 193, 194.

For instance, the electric terminals 91, 92, 93, 94 may be formed as terminal springs and the corresponding electric counter terminals 191, 192, 193, 194 as contact pads. Alternatively, the electric terminals 91, 92, 93, 94 may be formed as press-fit pins or as solder pins and the corresponding electric counter terminals 191, 192, 193, 194 as contact holes.

To boost the dielectric strength the interior of the module housing 6 is partly potted with an optional soft potting compound 51, for instance a silicon gel extending, for example, in the vertical direction v from the insulating substrate 2 at least beyond the power semiconductor chips 8 or at least beyond the bond wires 82, for instance, and, optionally, as far as the printed circuit board 95. The soft potting compound 51 is topped by an optional rigid potting compound 52, for example an epoxy resin, to electrically insulate the electric terminals 91, 92, 93, 94 and for added mechanical stability. It shall be noted that in order to show the internal run of the electric terminals 91, 92, 93, 94, the soft potting compound 51 and the hard potting compound 52 is partly removed in FIGS. 1 to 5.

The electric terminals 91, 92, 93, 94 extend from the interior of the module housing 6 to the exterior of the module housing 6, thereby penetrating the top side 6b of the module housing 6 at feed-through locations 65. For example, the feed-through locations 65 may be through-holes formed in an optional housing cover 62. If there is no housing cover 62 provided, the feed-through locations 65 may be formed as channels in the hard potting compound 52. Such channels occur when the electric terminals 91, 92, 93, 94 are embedded in the hard potting compound 52 during the potting process.

If the power semiconductor module 100 is operated in a corrosive atmosphere containing for example at least one corrosive compound like water vapor, salt fog, hydrogen sulfide ($H_2S$) or acid sulphur ($H_2SO_4$), there is a risk that the corrosive compound(s) enter the interior of the module 100 if the interior is not hermetically sealed by the feed-through locations 65. This may happen, if the feed-through locations 65 and/or the joining means 7 are intermittent or if at least one of the hard potting compound 52, the soft potting compound 51 and the joining means 7 do not sufficiently prevent a diffusion of the corrosive compounds.

In order to avoid or reduce the corrosion problem, a power semiconductor module 100 may be furnished with one or more sealing rings. For instance, in the power semiconductor module 100 shown in FIG. 1, the module housing 6 is fitted with a first sealing ring 41 and a second sealing ring 42. The first sealing ring 41 is arranged on the top side 6t of the module housing 6 such that in any lateral direction r perpendicular to the vertical direction v the number of electric terminals 91, 92, 93, 94 is arranged within the inner lateral boundary 411 of the first sealing ring 41. Accordingly, the second sealing ring 42 is arranged on the bottom side 6b of the module housing 6 such that in any lateral direction r perpendicular to the vertical direction v the bottom side 7f of the sealing means 7 is arranged within the inner lateral boundary 421 of the second sealing ring 42.

If the external printed circuit board 110 is pressed against the power semiconductor module 100, the electric terminals 91, 92, 93, 94 make contact with the corresponding electric counter terminals 191, 192, 193 and 194, respectively, and the first sealing ring 41 contacts the printed circuit board 110 and seals, together with the printed circuit board 110 and the module housing 6, the feed-through locations 65 against corrosive compounds. Of course, the printed circuit board 110 is required to be tight against the corrosive compounds at least in its section which is in any lateral direction r arranged within the inner lateral boundary 411 of the first sealing ring 41.

Accordingly, if a heat sink 120 is pressed against the power semiconductor module 100, the second sealing ring 42 contacts the heat sink 120 and seals, together with the heat sink 120 and the module housing 6, the joining means 7 against corrosive compounds. Of course, the heat sink 120 is required to be tight against the corrosive compounds at least in its section which is in any lateral direction r arranged within the inner lateral boundary 421 of the second sealing ring 42.

Figure 2:
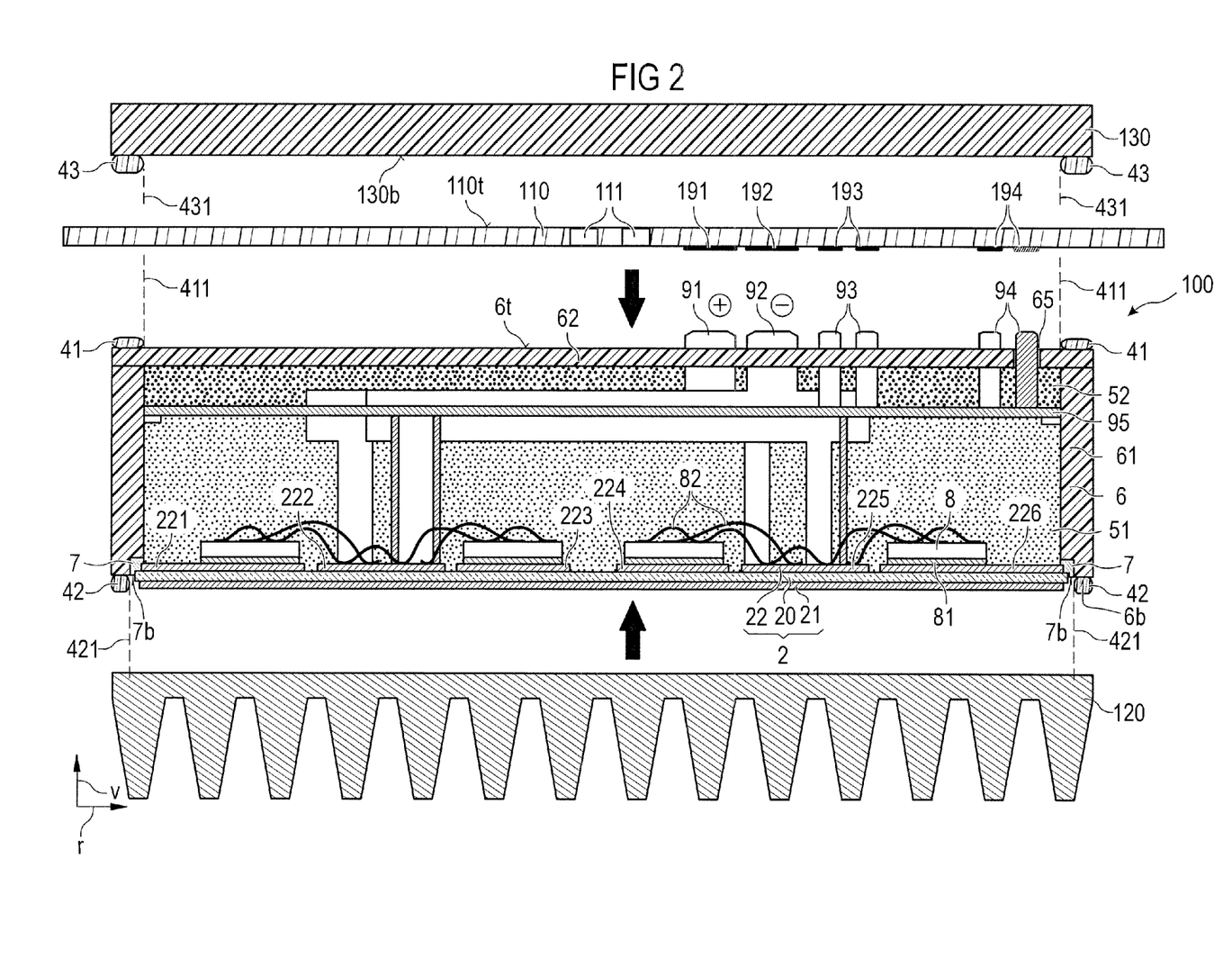
FIG. 2 is a vertical section through a power semiconductor arrangement with a power semiconductor module, a heat sink, an external printed circuit board and a counter holder prior to being assembled, wherein the power semiconductor module is furnished with a first sealing ring and a second sealing ring, and wherein the counter holder is furnished with a third sealing ring.

In case the printed circuit board 110 is no tight against the corrosive compounds in its section which is in any lateral direction r arranged within the inner lateral boundary 411 of the first sealing ring 41, a counter holder 130 as shown in FIG. 2 may be used. In that embodiment, the printed circuit board 110 is not tight due to through holes 111. On its bottom side 130b facing towards the power semiconductor module 100, a third sealing ring 43 is arranged. If the printed circuit board 110 is pressed against the power semiconductor module 100 as explained above and if the counter holder 130 is pressed against the printed circuit board 110, the third sealing ring 43 contacts the top side 110t of printed circuit board 110 and seals, together with the first sealing ring 41, the printed circuit board 110, the module housing 6 and the counter holder 130, the feed-through locations 65 against corrosive compounds. Of course, the counter holder 130 is required to be tight against the corrosive compounds at least in its section which is in any lateral direction r arranged within the inner lateral boundary 431 of the third sealing ring 43.

Figure 3:
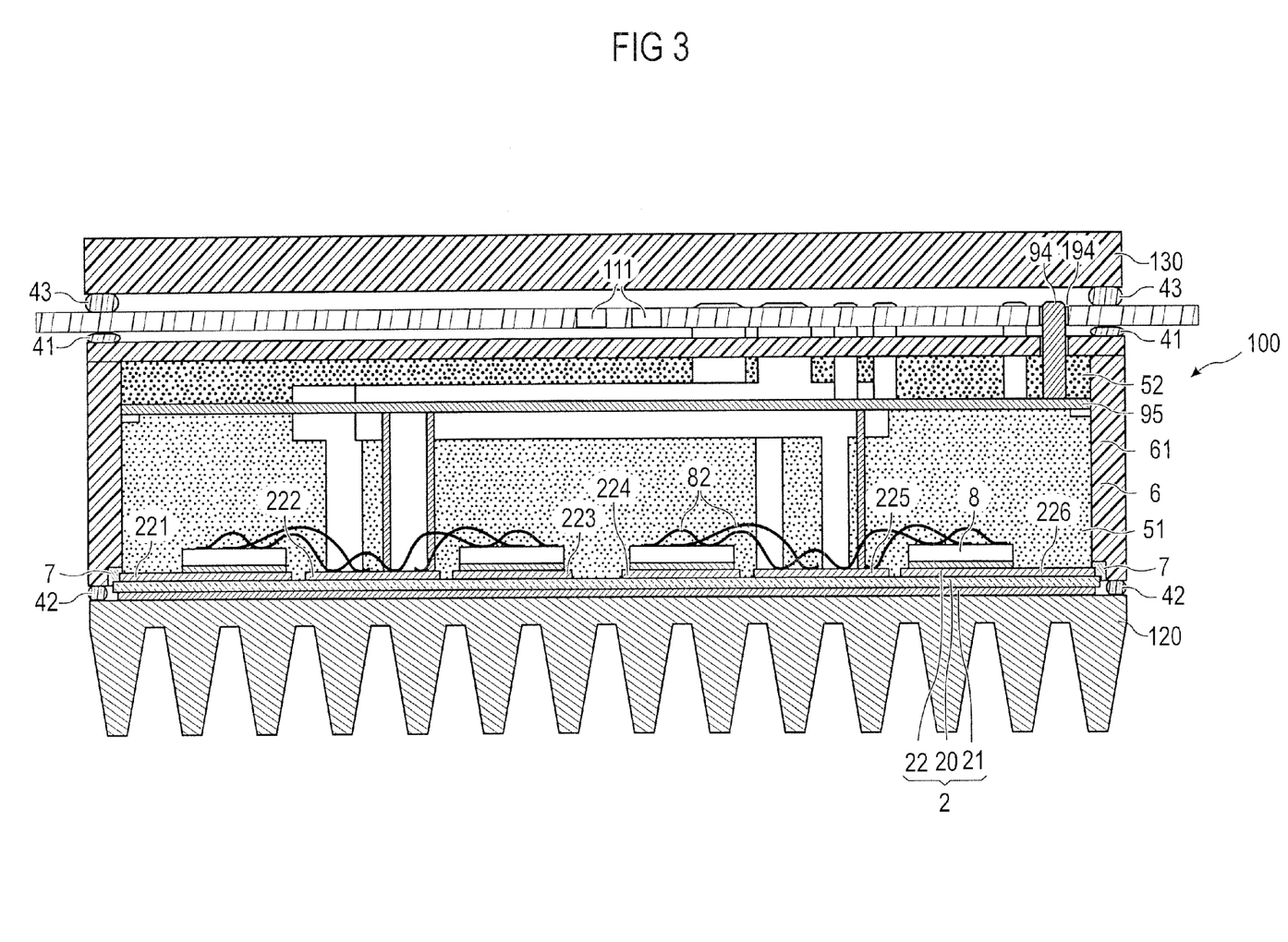
FIG. 3 is a vertical section through an assembled power semiconductor arrangement including a power semiconductor module, a heat sink, an external printed circuit board and a counter holder, wherein the electric contact between the power semiconductor module and the external printed circuit is realized by means of press-fit pins.

In the arrangement of FIGS. 1 and 2, the electric terminals 91, 92, 93, 94 are exemplary formed as terminal springs and the corresponding electric counter terminals 191, 192, 193, 194 as contact pads. FIG. 3 shows an arrangement substantially identical to the arrangement of FIG. 2 but in the assembled state, that is with the counter holder 130 and the heat sink 120 pressed against the power semiconductor module 100. As a further difference, the electric terminals 91, 92, 93, 94 are formed as press-fit pins which are pressed into corresponding electric counter terminals 191, 192, 193, 194 formed as contact holes.

Figure 4:
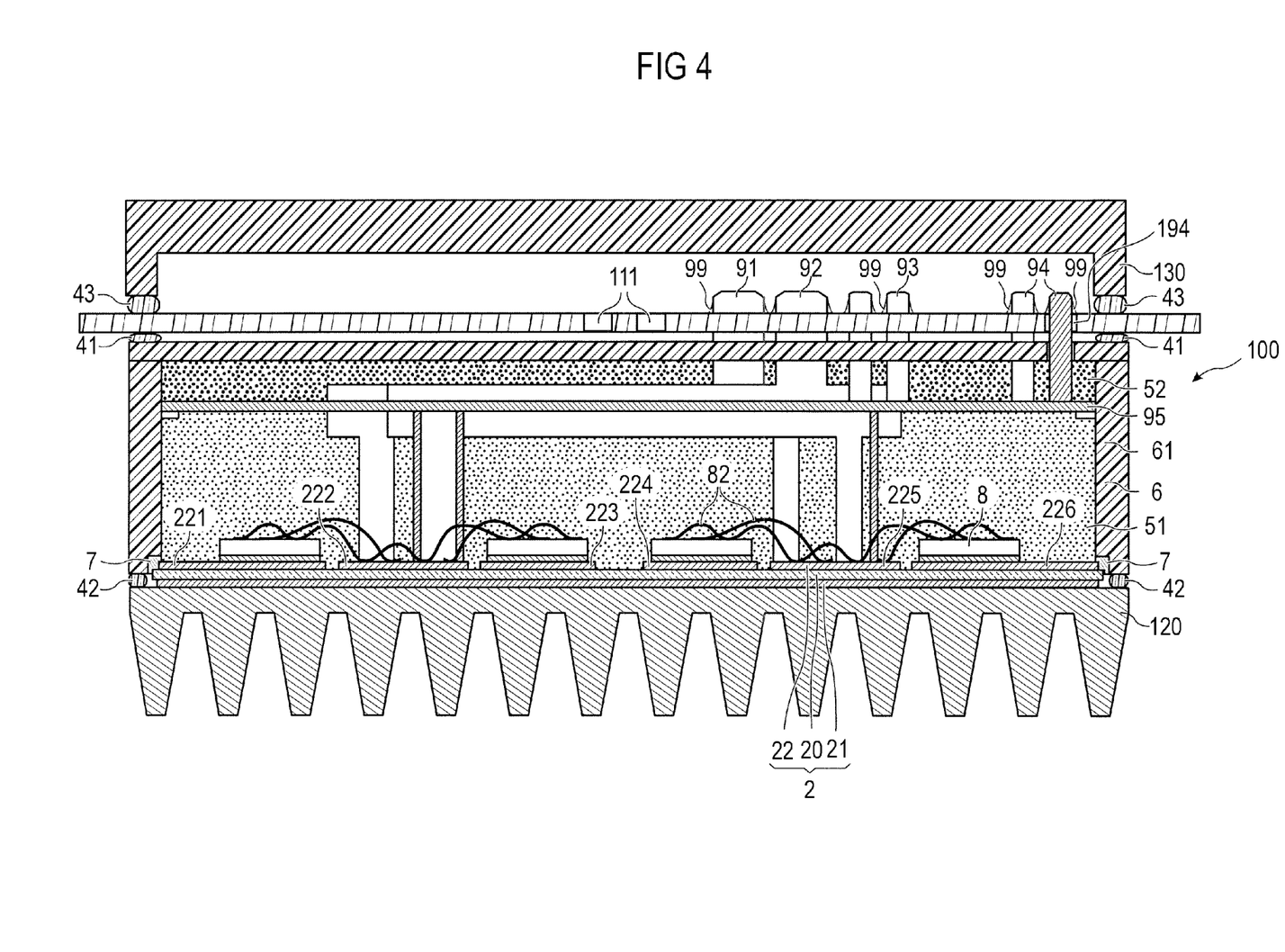
FIG. 4 is a vertical section through an assembled power semiconductor arrangement including a power semiconductor module, a heat sink, an external printed circuit board and a counter holder, wherein the electric contact between the power semiconductor module and the external printed circuit is realized by means of solder pins.

FIG. 4 shows an arrangement substantially identical to the arrangement of FIG. 3 with the difference that the electric terminals 91, 92, 93, 94 are formed as solder pins which are introduced into corresponding electric counter terminals 191, 192, 193, 194 formed as contact holes and soldered to the respective corresponding electric counter terminals 191, 192, 193, 194 by a solder 99. A further difference relates to the counter holder 130 which is provided with an annular projection on which the third sealing ring 43 is arranged.

Figure 5:
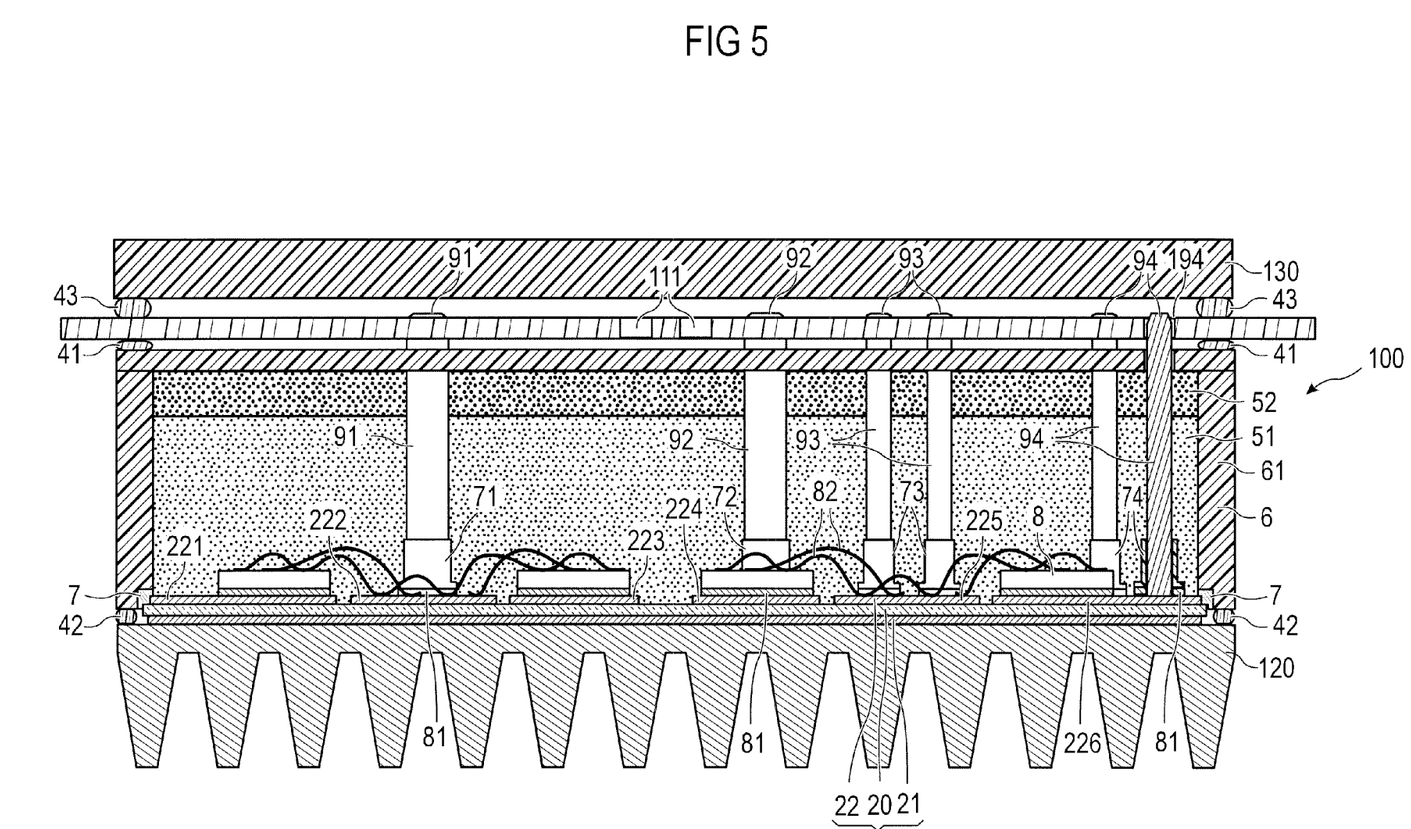
FIG. 5 is a vertical section through an assembled power semiconductor arrangement with press-fit pins similar to the arrangement of FIG. 3, wherein the terminals for externally connecting the power semiconductor module are inserted into a socket soldered to the substrate.

FIG. 5 shows an arrangement similar to the arrangement of FIG. 3 with electric terminals 91, 92, 93, 94 formed as press-fit pins which are pressed into corresponding electric counter terminals 191, 192, 193, 194 formed as contact holes. The terminals 91, 92, 93, 94 extend through the top side of the module housing 6 and the optional housing cover 62 into the interior of the housing 6 where they are plugged into sockets 71, 72, 73 and 74, respectively, electrically connected by a connection layer 81, for example a solder or a silver comprising sinter layer, to the top side metallization layer 22 of the substrate 2.

Figure 6:
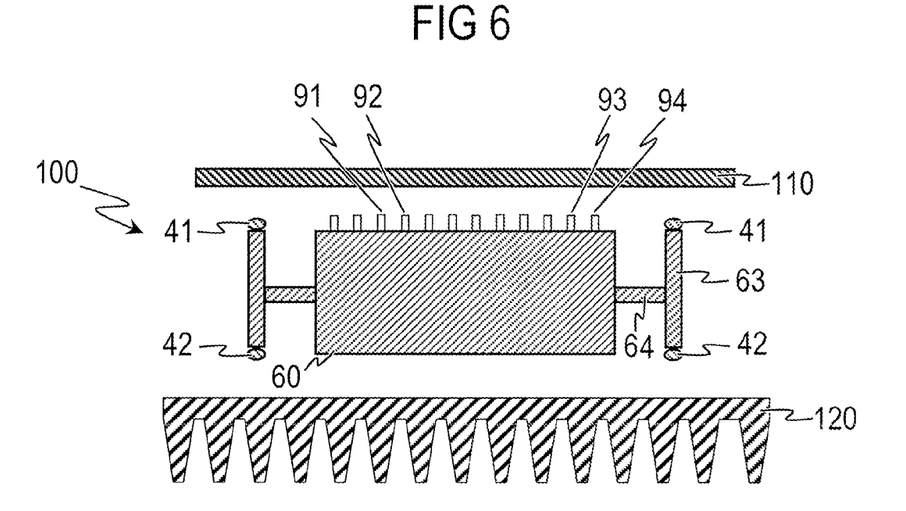
FIG. 6 illustrates a power semiconductor module arrangement, wherein the module features an inner housing which is arranged within a ring-shaped mounting frame, wherein a first sealing ring and a second sealing ring are arranged on the mounting frame.

A further embodiment of a power semiconductor module arrangement is schematically shown in FIG. 6. The module housing 6 features an inner housing 60 which may be designed like the module housing 6 as explained with reference to FIGS. 1 to 5, and which includes the same components except the first sealing ring 41 and the second sealing ring 42. Further, the module housing 6 exhibits a ring-shaped mounting frame 63. The inner housing 60 is arranged inside the mounting frame 63 and resiliently coupled to the mounting frame 63 by resilient coupling stripes 64.

If the mounting frame 63 is pressed against the heat sink 120, the inner housing 60 is also pressed against the heat sink 120. Due to the resilient coupling stripes 64, overstressing the inner housing 60 and in particular the ceramic substrate arranged therein can be avoided. In the arrangement of FIG. 6 it is exemplary shown that the first sealing ring 41 and the second sealing ring 42 may be arranged on the mounting frame 63 instead on the inner housing 60. In the assembled state, the mounting frame 63 together with the printed circuit board 110, the heat sink 120, the first sealing ring 41 and the second sealing ring 42 hermetically seal the inner housing 60.

Figure 7:
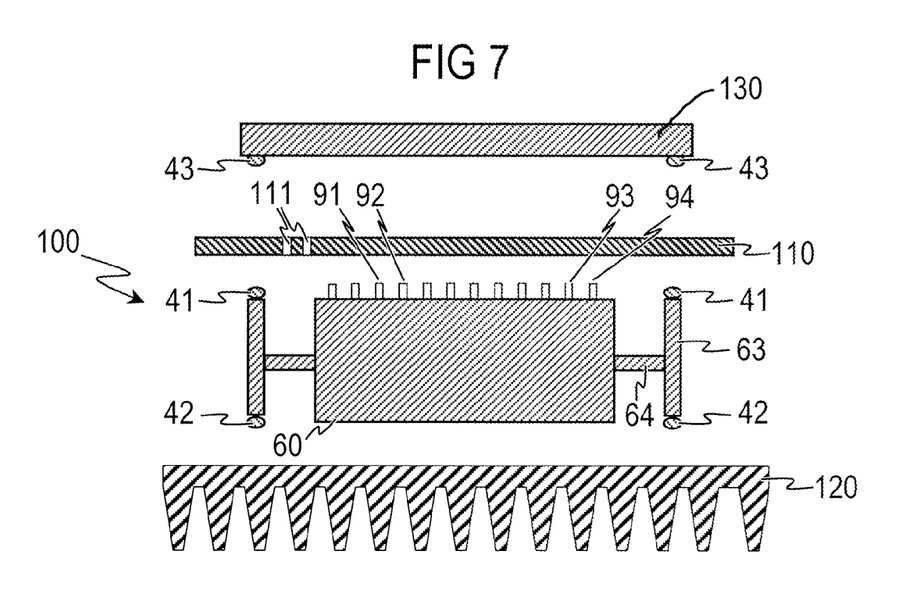
FIG. 7 illustrates a power semiconductor module arrangement with a power semiconductor module, a printed circuit board, a heat sink, and a counter holder.

Referring now to FIG. 7 there is illustrated a further embodiment of a still unassembled power semiconductor module arrangement. This arrangement is substantially similar to the arrangement of FIG. 6. However, the printed circuit board 110 is not tight due to through holes 111 in the same way as explained above with reference to FIGS. 3 to 5. Therefore, an additional counter holder 130 with a third sealing ring 43 arranged on that side of the counter holder 130 facing the power semiconductor module 100 is provided. The effectiveness of the counter holder 130 is the same as also explained with reference to FIGS. 3 to 5. In the assembled state, the mounting frame 63 together with the printed circuit board 110, the counter holder 130, the third sealing ring 43, the heat sink 120, the first sealing ring 41 and the second sealing ring 42 hermetically seal the inner housing 60.

Figure 8:
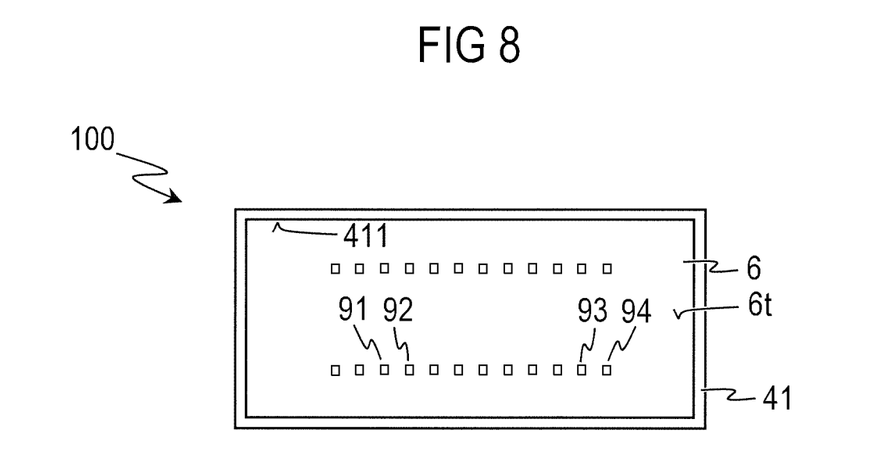
FIG. 8 is a top view of a power semiconductor module.

FIG. 8 is a top view of a power semiconductor module 100 illustrating that the first sealing ring 41 is a closed ring. It is also illustrated that in any lateral direction the electric terminals 91, 92, 93, 94 are arranged within the inner lateral boundary 411 of the first sealing ring 41.

Figure 9:
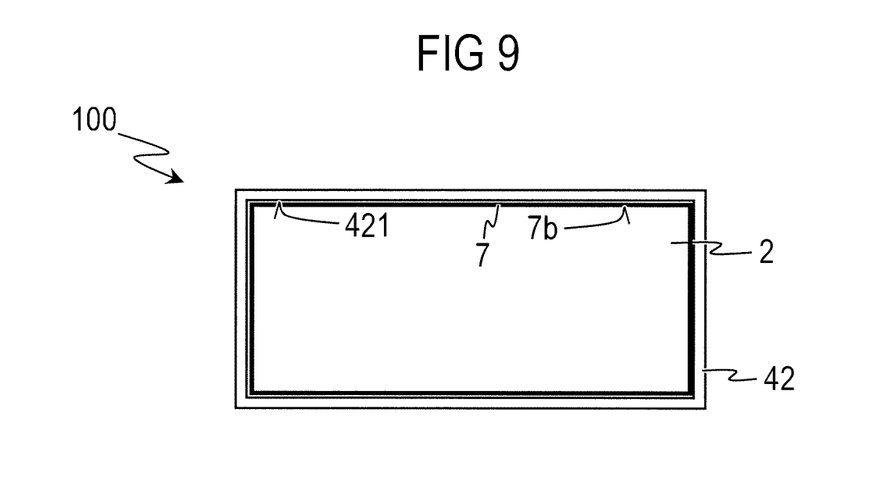
FIG. 9 is a bottom view of a power semiconductor module.

FIG. 9 is a bottom view of a power semiconductor module 100 illustrating that the second sealing ring 42 is a closed ring. It is also illustrated that in any lateral direction the bottom side 7b of the joining means 7 is arranged within the inner lateral boundary 421 of the second sealing ring 42.

Figure 10:
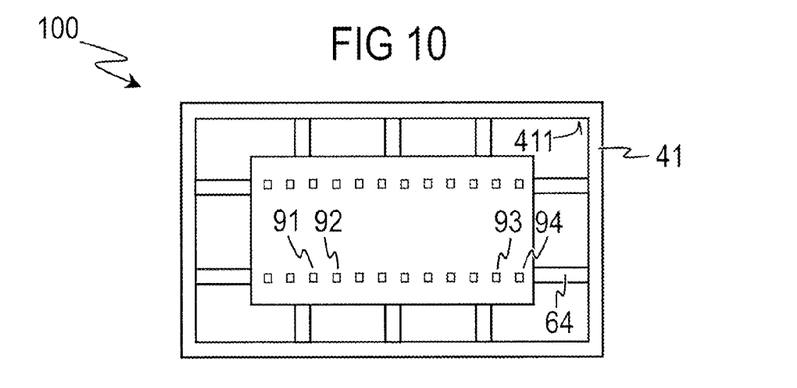
FIG. 10 is a top view of the power semiconductor module of FIG. 5.

FIG. 10 is a top view of the power semiconductor module 100 shown in FIG. 6. This view illustrates that the first sealing ring 41 is a closed ring and that in any lateral direction the inner module housing 60 and the electric terminals 91, 92, 93, 94 are arranged within the inner lateral boundary 411 of the first sealing ring 41.

Figure 11:
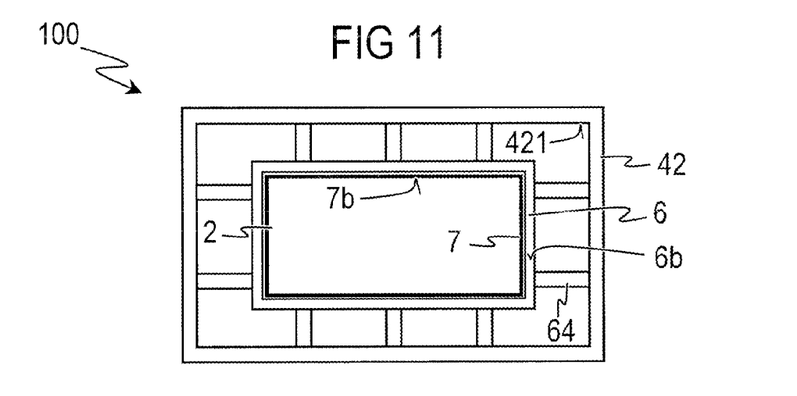
FIG. 11 is a bottom view of the power semiconductor module of FIG. 5.

Accordingly, FIG. 11 is a bottom view of the power semiconductor module 100 shown in FIG. 6 illustrating that the second sealing ring 42 is a closed ring and that in any lateral direction the bottom side 7b of the joining means 7 is arranged within the inner lateral boundary 421 of the second sealing ring 42.

Figure 12:
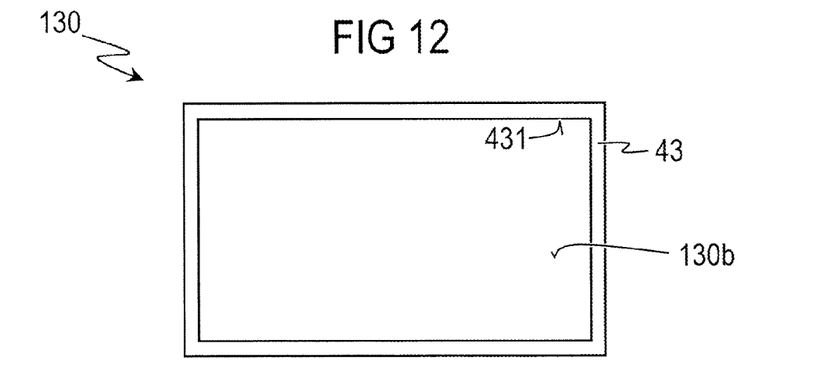
FIG. 12 is a bottom view of the counter holder 130.

FIG. 12 is a bottom view of the counter holder 130 illustrating that the third sealing ring 43 is a closed ring.

The sealing rings, for instance the above mentioned first, second and third sealing ring 41, 42, 43, may be made of an elastic material, for example silicone, rubber, polyurethane, adhesive glue, polytetrafluoroethylene (PTFE), paper or other suitable sealing materials.

In the described arrangements, the power semiconductor module 100, the external printed circuit board 110, the heat sink 120, and—if provided—the counter holder 130 are pressed against one another. In order to keep that pressure, the mentioned components may be connected to one another by any suitable means, for example by screwing or clamping. In the examples above, such connecting means for connecting the mentioned components are present, even though such connecting means were not described in detail.

According to a further embodiment, the described modules may include a metallic base plate, for example made of copper, aluminum or a metal-matrix material, as the base of the power semiconductor module and which serves as a carrier for all ceramic substrates of the module. Such a base plate can also be referred to as a substrate.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Different features described in the same or in different ones of the above embodiments may be combined with one another in any permutation unless otherwise mentioned or unless the different features are mutually exclusive.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module, comprising:
   a module housing having a top side and a bottom side forming opposite sides of the module housing and being spaced apart from one another in a vertical direction;
   a power semiconductor chip;
   a substrate carrying the power semiconductor chip, the substrate being mechanically joined with the module housing;
   a plurality of electric terminals extending from the interior of the module housing to the exterior of the module housing and penetrating the top side of the module housing at feed-through locations;
   a first sealing ring arranged on the top side of the module housing such that in any lateral direction perpendicular to the vertical direction the plurality of electric terminals are arranged within an inner lateral boundary of the first sealing ring; and a second sealing ring arranged on the bottom side of the module housing such that in any lateral direction perpendicular to the vertical direction an outer lateral boundary of the bottom side of a bond seam is arranged within an inner lateral boundary of the second sealing ring, wherein the substrate is adhered to the bottom side of the module housing via the bond seam, and wherein the bond seam comprises a bottom side facing away from the top side of the module housing.

2. The semiconductor module as set forth in claim 1, wherein the plurality of electric terminals are formed as terminal springs or as press-fit pins or as or as solder pins.

3. The semiconductor module as set forth in claim 1, wherein the first sealing ring is made of one the following materials: silicone, rubber, polyurethane, adhesive glue, polytetrafluorethylene (PTFE), and paper.

4. The semiconductor module as set forth in claim 1, wherein each of the plurality of electric terminals is spaced distant from the first sealing ring.

5. The semiconductor module as set forth in claim 1 wherein,
the module housing comprises a frame and an inner housing arranged inside the frame.

6. The semiconductor module as set forth in claim 5 wherein,
the first sealing ring is arranged on the frame.

7. The semiconductor module as set forth in claim 1, wherein the plurality of electric terminals are plugged into sockets soldered to the substrate.

8. A semiconductor module system, comprising:
a power semiconductor module comprising:
a module housing having a top side and a bottom side forming opposite sides of the module housing and being spaced apart from one another in a vertical direction;
a power semiconductor chip;
a substrate carrying the power semiconductor chip, the substrate being mechanically joined with the module housing;
a plurality of electric terminals extending from the interior of the module housing to the exterior of the module housing and penetrating the top side of the module housing at feed-through locations; and
a first sealing ring arranged on the top side of the module housing around the plurality of electric terminals; and
a counter holder having a bottom side on which a third sealing ring is arranged;
wherein the counter holder is arranged on the top side of the module housing with the bottom side of the counter holder facing toward the top side of the module housing such that in any lateral direction perpendicular to the vertical direction the plurality of electric terminals are arranged within an inner lateral boundary of the third sealing ring.

9. The semiconductor module system as set forth in claim 8, wherein the plurality of electric terminals are formed as terminal springs or as press-fit pins or as or as solder pins.

10. A semiconductor module arrangement, comprising:
a power semiconductor module comprising:
a module housing having a top side and a bottom side forming opposite sides of the module housing and being spaced apart from one another in a vertical direction;
a power semiconductor chip;
a substrate carrying the power semiconductor chip, the substrate being mechanically joined with the module housing;
a plurality of electric terminals extending from the interior of the module housing to the exterior of the module housing and penetrating the top side of the module housing at feed-through locations; and
a first sealing ring arranged on the top side of the module housing around the plurality of electric terminals; and
a printed circuit board comprising a plurality of counter terminals;
wherein the printed circuit board is arranged on the top side of the module housing such that
each one of the plurality of terminals forms an electric contact with one of the counter terminals, and the printed circuit board, the first sealing ring and the module housing together hermetically seal the feed-through locations on the top side of the module housing.

11. The semiconductor module arrangement as set forth in claim 10, further comprising a heat sink, wherein:
the substrate is adhered to the bottom side of the module housing via a bond seam;
the bond seam comprises a bottom side facing away from the top side of the module housing;
a second sealing ring is arranged on the bottom side of the module housing such that in any lateral direction perpendicular to the vertical direction the bottom side of the bond seam is arranged within an inner lateral boundary of the second sealing ring;
the heat sink is pressed against the second sealing ring; and
the module housing, the substrate, the bond seam, the printed circuit board, the first sealing ring, the heat sink and the second sealing ring together hermetically seal the bond seam on the bottom side of the module housing.

12. The semiconductor module as set forth in claim 10, wherein the plurality of electric terminals are formed as terminal springs or as press-fit pins or as or as solder pins.

13. A semiconductor module arrangement, comprising:
a power semiconductor module comprising:
a module housing having a top side and a bottom side forming opposite sides of the module housing and being spaced apart from one another in a vertical direction;
a power semiconductor chip;
a substrate carrying the power semiconductor chip, the substrate being mechanically joined with the module housing;
a plurality of electric terminals extending from the interior of the module housing to the exterior of the module housing and penetrating the top side of the module housing at feed-through locations; and
a first sealing ring arranged on the top side of the module housing around the plurality of electric terminals;
a counter holder having a bottom side on which a third sealing ring is arranged; and
a printed circuit board comprising a plurality of counter terminals;
wherein the counter holder and the printed circuit board are arranged on the top side of the module housing such that the printed circuit board is arranged between the counter holder and the power semiconductor module, each one of the plurality of terminals forms an electric contact with one of the counter terminals, and the counter holder, the printed circuit board and the first sealing ring together hermetically seal the feed-through locations on the top side of the module housing.

14. The semiconductor module arrangement as set forth in claim 13, further comprising a heat sink, wherein:
- the substrate is adhered to the bottom side of the module housing via a bond seam having a bottom side facing away from the top side of the module housing;
- a second sealing ring is arranged on the bottom side of the module housing such that in any lateral direction perpendicular to the vertical direction the bottom side of the bond seam is arranged within an inner lateral boundary of the second sealing ring;
- the heat sink is pressed against the second sealing ring; and
- the module housing, the substrate, the bond seam, the printed circuit board, the first sealing ring, the heat sink and the second sealing ring together hermetically seal the bond seam on the bottom side of the module housing.

15. The semiconductor module arrangement as set forth in claim 14, wherein the plurality of electric terminals are formed as terminal springs or as press-fit pins or as or as solder pins.

16. A semiconductor module arrangement, comprising:
a power semiconductor module comprising:
- a module housing having a top side and a bottom side forming opposite sides of the module housing and being spaced apart from one another in a vertical direction, wherein the module housing comprises a mounting frame and an inner housing arranged within the mounting frame;
- a power semiconductor chip;
- a substrate carrying the power semiconductor chip, the substrate being mechanically joined with the module housing;
- a plurality of electric terminals extending from the interior of the inner module housing to the exterior of the inner module housing and penetrating the top side of the inner module housing at feed-through locations; and
- a first sealing ring arranged on the mounting frame on the top side of the module housing;
- a second sealing ring arranged on the mounting frame on the bottom side of the module housing;
a printed circuit board comprising a plurality of counter terminals; and
a heat sink;
wherein the printed circuit board is arranged on the top side of the module housing, the heat sink is arranged on the bottom side of the module housing such that each one of the plurality of terminals forms an electric contact with one of the counter terminals; and the printed circuit board, the first sealing ring, the mounting frame, the second sealing ring and the heat sink together hermetically seal the inner module housing.

17. The semiconductor module arrangement as set forth in claim 16, wherein the plurality of electric terminals are formed as terminal springs or as press-fit pins or as or as solder pins.

18. A semiconductor module arrangement, comprising:
a power semiconductor module comprising:
- a module housing having a top side and a bottom side forming opposite sides of the module housing and being spaced apart from one another in a vertical direction, wherein the module housing comprises a mounting frame and an inner housing arranged within the mounting frame;
- a power semiconductor chip;
- a substrate carrying the power semiconductor chip, the substrate being mechanically joined with the module housing;
- a plurality of electric terminals extending from the interior of the inner module housing to the exterior of the inner module housing and penetrating the top side of the inner module housing at feed-through locations; and
- a first sealing ring arranged on the mounting frame on the top side of the module housing;
- a second sealing ring arranged on the mounting frame on the bottom side of the module housing;
a counter holder having a bottom side on which a third sealing ring is arranged; and
a printed circuit board comprising a plurality of counter terminals;
a heat sink;
wherein the counter holder and the printed circuit board are arranged on the top side of the module housing and the heat sink is arranged on the bottom side of the module housing such that the printed circuit board is arranged between the counter holder and the power semiconductor module; each one of the plurality of terminals forms an electric contact with one of the counter terminals; and the counter holder, the third sealing ring, the printed circuit board, the first sealing ring, the mounting frame, the second sealing ring and the heat sink together hermetically seal the inner module housing.

19. The semiconductor module arrangement as set forth in claim 18, wherein the plurality of electric terminals are formed as terminal springs or as press-fit pins or as or as solder pins.

20. A method for assembling a semiconductor module arrangement, comprising:
providing a power semiconductor module including:
- a module housing having a top side and a bottom side forming opposite sides of the module housing and being spaced apart from one another in a vertical direction;
- a power semiconductor chip;
- a substrate carrying the power semiconductor chip, the substrate being mechanically joined with the module housing;
- a plurality of electric terminals extending from the interior of the module housing to the exterior of the module housing and penetrating the top side of the module housing at feed-through locations; and
- a first sealing ring arranged on the top side of the module housing around the electric terminals;
providing a printed circuit board comprising a plurality of counter terminals;
providing a heat sink;
arranging the power semiconductor module between the printed circuit board and the heat sink such that the top side of the module housing faces the printed circuit board and the bottom side of the module housing faces the heat sink;
pressing the printed circuit board, the power semiconductor module and the heat sink against one another such that the first sealing ring is compressed by the printed circuit board and the module housing and the second sealing ring is compressed by the heat sink and the module housing and that the module housing, the substrate, the printed circuit board, and the first sealing ring together hermetically seal the feed-through locations on the top side of the module housing; and
wherein during the pressing each one of the plurality of electric terminals forms an electric contact with one of the counter terminals.

21. A method for assembling a semiconductor module arrangement, comprising:
  providing a power semiconductor module comprising:
    a module housing having a top side and a bottom side forming opposite sides of the module housing and being spaced apart from one another in a vertical direction;
    a power semiconductor chip;
    a substrate carrying the power semiconductor chip, the substrate being mechanically joined with the module housing;
    a plurality of electric terminals extending from the interior of the module housing to the exterior of the module housing and penetrating the top side of the module housing at feed-through locations; and
    a first sealing ring arranged on the top side of the module housing around the electric terminals; and
  providing a printed circuit board comprising a plurality of counter terminals;
  providing a counter holder having a bottom side on which a third sealing ring is arranged;
  providing a heat sink;
  arranging the printed circuit board between the counter holder and the power semiconductor module and the power semiconductor module between the printed circuit board and the heat sink such that the bottom side of the counter holder faces the printed circuit board and the module housing, the top side of the module housing faces the printed circuit board and the bottom side of the module housing faces the heat sink;
  pressing the counter holder, the printed circuit board, the power semiconductor module and the heat sink against one another such that the first sealing ring is compressed by the printed circuit board and the module housing, the second sealing ring is compressed by the heat sink and the module housing, the third sealing ring is compressed by the counter holder and the module housing, each one of the plurality of terminals forms an electric contact with one of the counter terminals, the counter holder, the third sealing ring, the printed circuit board, the first sealing ring and the module housing together hermetically seal the feed-through locations on the top side of the module housing, and the module housing, the second sealing ring and the heat sink together hermetically seal the bottom side of a bond seam.

22. The method as set forth in claim 21, wherein
  the plurality of electric terminals are formed as press-fit pins;
  the plurality of electric counter terminals are formed as contact holes of the printed circuit board; and
  during the pressing each one of the press-fit pins is pressed into one of the contact holes.

23. The method as set forth in claim 21, wherein
  the plurality of electric terminals are formed as terminal springs;
  the plurality of electric counter terminals are formed as contact pads of the printed circuit board; and
  during the pressing each one of the terminal springs is pressed against one of the contact pads.

* * * * *

UNITED STATES PATENT AND TRADEMARK OFFICE
CERTIFICATE OF CORRECTION

PATENT NO. : 8,446,726 B2
APPLICATION NO. : 12/914171
DATED : May 21, 2013
INVENTOR(S) : Ralf Schloerke et al.

It is certified that error appears in the above-identified patent and that said Letters Patent is hereby corrected as shown below:

In the Claims

Column 11, line 16 (claim 2, line 3) please change "pins or as or as solder" to -- pins or as solder --

Column 11, line 60 (claim 9, line 3) please change "pins or as or as solder" to -- pins or as solder --

Column 12, line 38 (claim 12, line 3) please change "pins or as or as solder" to -- pins or as solder --

Column 13, line 18 (claim 15, line 3) please change "pins or as or as solder" to -- pins or as solder --

Column 13, line 54 (claim 17, line 3) please change "pins or as or as solder" to -- pins or as solder --

Column 14, line 29 (claim 19, line 3) please change "pins or as or as solder" to -- pins or as solder --

Signed and Sealed this
Eighteenth Day of February, 2014

Michelle K. Lee
*Deputy Director of the United States Patent and Trademark Office*